United States Patent
Ghosh et al.

(10) Patent No.: US 7,245,065 B2
(45) Date of Patent: Jul. 17, 2007

(54) REDUCING ANGULAR DEPENDENCY IN MICROCAVITY COLOR OLEDS

(75) Inventors: Amalkumar P. Ghosh, Fishkill, NY (US); Michael J. Carmody, Webster, NY (US); Joel D. Shore, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 188 days.

(21) Appl. No.: 11/095,166

(22) Filed: Mar. 31, 2005

(65) Prior Publication Data
US 2006/0220509 A1    Oct. 5, 2006

(51) Int. Cl.
*H01J 1/62*    (2006.01)
(52) U.S. Cl. ............ 313/110; 313/506; 313/504; 313/509; 313/512
(58) Field of Classification Search ........... 313/110
See application file for complete search history.

(56) References Cited

U.S. PATENT DOCUMENTS

| 4,356,429 A | 10/1982 | Tang |
| 4,769,292 A | 9/1988 | Tang et al. |
| 4,885,211 A | 12/1989 | Tang et al. |
| 5,276,380 A | 1/1994 | Tang |
| 5,550,066 A | 8/1996 | Tang et al. |
| 5,780,174 A | 7/1998 | Tokito et al. |
| 6,281,634 B1 | 8/2001 | Yokoyama |
| 6,406,801 B1 | 6/2002 | Tokito et al. |
| 6,456,013 B1 | 9/2002 | Komiya et al. |
| 6,965,197 B2* | 11/2005 | Tyan et al. ........... 313/506 |
| 7,012,363 B2* | 3/2006 | Weaver et al. ........ 313/504 |

FOREIGN PATENT DOCUMENTS

JP    11-288786    10/1999

OTHER PUBLICATIONS

Takada et al, Control of emission characteristics in organic thin-film electroluminescent diodes using an optical-microcavity structure, Appl. Phys. Lett. 63 (15) Oct. 11, 1993, pp. 2032-2034.

* cited by examiner

*Primary Examiner*—David Bruce
*Assistant Examiner*—Conrad R. Blease
(74) *Attorney, Agent, or Firm*—Raymond L Owens (57) ABSTRACT

A microcavity color OLED device, includes at least one light-emitting layer arranged so as to produce light; a reflector and a semi-transparent reflector forming a microcavity structure for resonating the light produced in the at least one light emitting layer; and a color filter element disposed over the microcavity structure including a light-scattering material selected so as to reduce the angular dependence of the light that has passed through the color filter element.

36 Claims, 8 Drawing Sheets

REDUCING ANGULAR DEPENDENCY IN MICROCAVITY COLOR OLEDS

FIELD OF THE INVENTION

The present invention relates to organic electroluminescent (EL) devices. More specifically, this invention relates to an emitting EL device with improved viewing angle.

BACKGROUND OF THE INVENTION

Full color organic electroluminescent (EL) devices, also known as organic light-emitting diode (OLED) devices, have been demonstrated as a new type of flat panel display. OLED devices are attractive because of their low driving voltage, high luminance, wide-angle viewing and capability for full-color flat emission displays. In its simplest form, an organic EL device is comprised of an anode for hole injection, a cathode for electron injection, and an organic EL medium sandwiched between these electrodes to support charge recombination that yields emission of light. An example of an organic EL device is described in commonly-assigned U.S. Pat. No. 4,356,429. Other examples have been described by Tang et al. in U.S. Pat. Nos. 4,769,292 and 4,885,211. In order to construct a pixilated display device that is useful, for example, as a television, computer monitor, cell phone display or digital camera display, individual organic EL elements can be arranged as an array of pixels in a matrix pattern. This matrix of pixels can be electrically driven using either a simple passive matrix or an active matrix driving scheme. In a passive matrix, the organic EL layers are sandwiched between two sets of orthogonal electrodes arranged in rows and columns. An example of a passive-matrix-driven organic EL device is disclosed in commonly-assigned U.S. Pat. No. 5,276,380. In an active matrix configuration, each pixel is driven by multiple circuit elements such as transistors, capacitors, and signal lines. Examples of such active matrix organic EL devices are provided in U.S. Pat. No. 5,550,066 (commonly-assigned); U.S. Pat. Nos. 6,281,634; and 6,456,013.

One way of improving the efficiency of an OLED device is the use of a microcavity structure to enhance emission at a specific wavelength. A reflector and a semitransparent reflector function, with the layers between them, to form a microcavity, which can be adjusted in thickness and refractive index to resonate at a desired wavelength. Examples of microcavity structures are shown in U.S. Pat. Nos. 6,406,801; 5,780,174 A1; and JP 11288786. A broadband-emitting OLED material can be used, and by varying the length of the cavity, different colored emission can be achieved. However, the resonant wavelength of a microcavity is also a function of angle and thus the color emitted by a microcavity OLED tends to have an undesirable dependence on angle, generally shifting toward the shorter wavelengths as the viewing angle shifts from normal to more oblique angles. The emission intensity of microcavity devices is also characteristically directional, and falls off fairly rapidly with viewing angle. (See, for example, N. Takada, T. Tsutsui, and S. Saito *Appl. Phys. Lett.* 63(15) 2032 (1993) "Control of emission characteristics in organic thin film electroluminescent diodes using an optical microcavity structure".) There exists a need for an efficient OLED with reduced image dependence on viewing angle.

SUMMARY OF THE INVENTION

It is therefore an object of the present invention to provide a microcavity electroluminescent device with improved viewing angle.

This object is achieved by a microcavity color OLED device, comprising:

a) at least one light emitting layer arranged so as to produce light;

b) a reflector and a semi-transparent reflector forming a microcavity structure for resonating the light produced in the at least one light emitting layer; and c) a color filter element disposed over the microcavity structure including a light scattering material selected so as to reduce the angular dependence of the light that has passed through the color filter element.

It is an advantage of this invention that it can improve the viewing angle of a microcavity OLED device. It is a further advantage of this invention that this improvement can be achieved without the need for a separate light-scattering layer, thereby reducing the manufacturing difficulty.

DETAILED DESCRIPTION OF THE INVENTION

The term "OLED device" or "organic light-emitting display" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is commonly employed to describe multicolor display panels that are capable of emitting in the red, green, and blue regions of the visible spectrum and displaying images in any combination of hues. The red, green, and blue colors constitute the three primary colors from which all other colors can be generated by appropriate mixing. However, the use of additional colors to extend the color gamut of the device is possible. The term "hue" refers to the intensity profile of light emission within the visible spectrum, with different hues exhibiting visually discernible differences in color. The term "pixel" is employed in its art-recognized usage to designate an area of a display panel that can be stimulated to emit light independently of other areas. However, it is recognized that in full-color systems, several light-emitting areas of different colors will be used together to generate a broad range of colors, and a viewer may term such a group a single pixel that includes different subpixels that emit different color light independently of other subpixels. In a full-color display, a pixel generally comprises three primary-color subpixels, namely red, green, and blue (RGB), which are color-gamut-defining subpixels. It is well known that microcavity structures can enhance emission of a relatively narrow range of wavelengths of light, and the term "particular wavelength" will be used to describe such an enhanced range of wavelengths.

Figure 1:
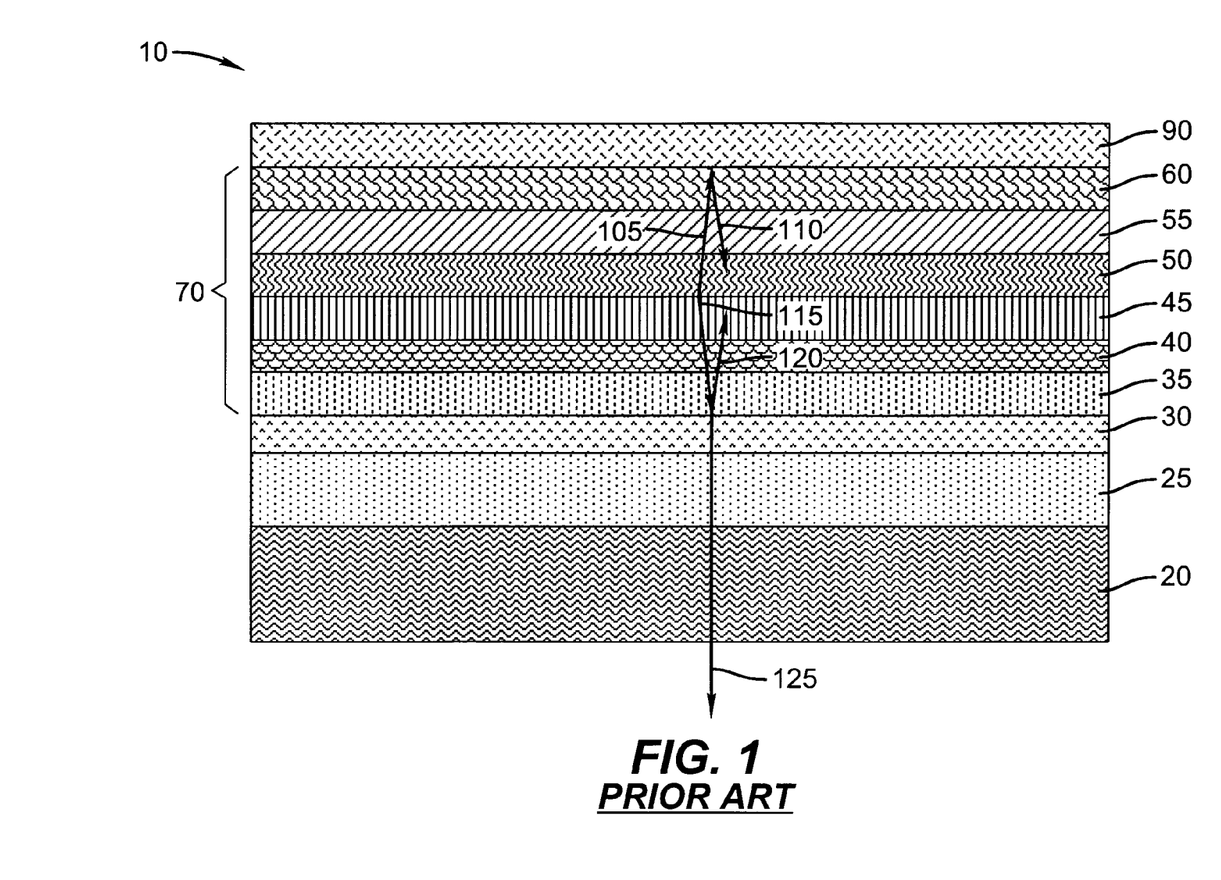
FIG. 1 shows a cross-sectional view of a prior art microcavity OLED device showing the effect of light emission in a microcavity.

FIG. 1 is a cross-sectional view of a single subpixel of a prior art microcavity color OLED device 10 showing the effect of light emission in a microcavity. The microcavity color OLED device is a full color OLED device that includes an array of pixels as is common in the art. Each pixel includes different subpixels that emit different color light and each subpixel has the structure shown. Microcavity OLED devices have been reported to achieve improved chromaticity and emission efficiency. Although microcavity color OLED device 10 is shown as emitting light from the bottom (that is, a bottom-emitting device), it will be understood that microcavity color OLED devices described herein can be top-emitting devices by suitable changes in layer structure well-known to those skilled in the art.

Microcavity color OLED device 10 includes a reflector 90, which is a material that is highly reflective at the wavelengths at which microcavity color OLED device 10 emits light. Preferred materials for reflector 90 that are highly reflective include Ag, Al, Au, or alloys composed of one or more of these materials. Microcavity color OLED device 10 also includes a semi-transparent reflector 30, which is partially reflective and partially transmissive. Suitable materials for semi-transparent reflector 30 include Ag, Au, or alloys composed of one or both of these materials, in a thickness selected to cause them to be semi-transparent, that is, partially transmitting and partially reflective. This thickness can be in the range of, for example, between 5 nm and 50 nm, and is more preferably between 15 nm and 30 nm. An alternate semi-transparent reflector structure composed of a quarter wave stack (QWS) of transparent materials with alternating high and low refractive indexes is also known and can be applied to the present invention by someone skilled in the art. Reflector 90 and semi-transparent reflector 30 are disposed on opposite sides of a light-emitting layer 50, which is arranged so as to produce light. The light produced by each subpixel is a different color, e.g. red light, green light, and blue light produced by red-light-emitting subpixels, green-light-emitting subpixels, and blue-light-emitting subpixels, respectively. Light-emitting layer 50 can be a different color light-emitting layer for each different color subpixel. Alternatively, light-emitting layer 50 can be a broadband-emitting layer wherein the light actually emitted to the viewer is a narrower range of wavelengths selected by the use of a color filter element 25 and a microcavity structure 70. In a bottom-emitting device, such as shown, where the light is viewed through a substrate 20, semi-transparent reflector 30 is located between light-emitting layer 50 and substrate 20, and reflector 90 is located above substrate 20, semi-transparent reflector 30, and light-emitting layer 50. Alternately, in a top-emitting device, that is where the light is viewed in the direction opposite substrate 20, reflector 90 would be located between light-emitting layer 50 and substrate 20, and semi-transparent reflector 30 would be located above substrate 20, reflector 90, and light-emitting layer 50.

Reflector 90 and semi-transparent reflector 30 function, with the layers between them, to form a microcavity structure 70, which can be adjusted in thickness and refractive index for resonating light of a desired wavelength produced in light-emitting layer 50. Examples of microcavity structures are shown in U.S. Pat. Nos. 6,406,801; 5,780,174 A1; and JP 11288786. A transparent cavity-spacer layer 35 can be used as an additional means to adjust the microcavity structure resonance wavelength. Light is shown as being emitted at the interface of a hole-transporting layer 45 and a light-emitting layer 50. Light 115 is on-axis light that is produced from light-emitting layer 50 in the direction of semi-transparent reflector 30 and is partially reflected as partially reflected light 120, and partially transmitted as partially transmitted on-axis light 125. Partially transmitted on-axis light 125 includes one or more narrow wavelength bands of light. That is, microcavity structure 70 enhances on-axis light produced from light-emitting layer 50 in at least one particular wavelength of on-axis light to produce a desired on-axis viewed color while not substantially enhancing or even suppressing other wavelengths of such light. Light 105 represents on-axis light that is emitted in the direction of reflector 90 and is reflected as reflected light 110. It will be partially reflected and partially transmitted at semi-transparent reflector 30.

The thickness of microcavity structure 70 including transparent cavity-spacer layer 35 (if present) is selected to tune the microcavity color OLED device 10 to have the resonance at the predetermined wavelength to be emitted from the device. The thickness satisfies the following equation:

$$2\Sigma n_i L_i + (Q_{m1}+Q_{m2})\lambda/2\pi = m\lambda \qquad \text{Eq.1}$$

wherein $n_i$ is the refractive index and $L_i$ is the thickness of the nth sub-layer between the reflector and semitransparent reflector in microcavity structure 70 (including any cavity-spacer layer 35 if used); $Q_{m1}$ and $Q_{m2}$ are the phase shifts in radians at the two organic EL element-reflector interfaces, respectively; $\lambda$ is the predetermined wavelength of on-axis light to be enhanced by microcavity structure 70, and m is a non-negative integer. For example, one can select the microcavity effect to enhance on-axis the emission of green light (as partially transmitted on-axis light 125) for a desired on-axis viewed color.

Though not shown, light can also be produced in an off-axis direction. Light emitted in an off-axis direction by a microcavity structure will have a different wavelength and luminance than light emitted on-axis. Typically, microcavity light emitted off-axis will have a shorter wavelength than light emitted on-axis.

Besides the layers already mentioned, microcavity color OLED device 10 can also include a hole-injecting layer 40, an electron-transporting layer 55, and an electron-injecting layer 60. Reflector 90 and semi-transparent reflector 30 also function as electrodes in this embodiment, but other embodiments are possible wherein the reflectors and the electrodes are separate entities or wherein only one of the reflector and semitransparent reflector serves as an electrode. The bottom electrode, i.e. the one closest to substrate 20, is most commonly configured as the anode and the other electrode as the cathode, but this invention is not limited to devices of that configuration. Microcavity color OLED device 10 can also include a color filter element 25 to further select the wavelength of light to be emitted by the device. Color filter element 25 can be any well-known filter and includes a selective light-absorbing material designed to remove light of wavelengths other than the desired wavelength of on-axis light.

Color filter element 25 is disposed outside of microcavity structure 70 on the side of semi-transparent reflector 30 so as to be between semi-transparent reflector 30 and the viewer. In a multicolored pixilated display, it is preferable to locate the color filter element as close to microcavity structure 70 as possible to reduce pixel crosstalk. A black matrix can further be included between pixel filter elements to further reduce interpixel crosstalk. In a bottom emitting device, color filter element 25 is therefore preferably located between microcavity structure 70 and substrate 20. However, the invention can also be made to work by placing color filter element 25 on the outside of substrate 20. In a top emitting device, color filter element 25 is preferably located above microcavity structure 70, but can also be located on either side of an attached second cover substrate (not shown). Color filter element 25 is selected so as to have a high transmittance at the wavelengths approximately corresponding to the desired color of the microcavity device and to have low transmittance at wavelengths of other colors of the visible light spectrum.

Color filter element 25 can arranged so as to permit for some filtered light emission and some unfiltered light emission. This is achieved by having the surface area of the filter overlapping the emitting area of the microcavity be less than the total area of the emitting area. The result of disposing color filter element 25 relative to the emitting area is that, as the device is viewed from angles off the normal, the typical color shift of a microcavity device is reduced in the filtered light emission. By designing the ratio of the surface area of color filter element 25 relative to the total emitting area, the ratio of filtered light emission to unfiltered light emission can be tuned, and the amount of color shift at non-normal viewing angles can be selected between the maximum value of a device with no color filter element and the minimum value of a device that has an emitting area which is completely covered by a color filter element. Since color filter element 25 absorbs a portion of the light produced by the microcavity, even at the desired color, the device will have lower brightness and is therefore less efficient than a device that has no color filter element. Designing the ratio of the surface area of color filter element 25 relative to the total emitting area also selects the efficiency of the device between the maximum value of a device with no color filter element, and the minimum value of a device that has an emitting area which is completely covered by a color filter element. Therefore, by constructing a microcavity device in this way, the amount of color shift can be traded against the overall efficiency of the device. However, this does not greatly improve the intensity of light viewed off-axis.

A means of improving the efficiency of OLED devices is by incorporating a layer containing scattering particles for the purpose of redirecting some of the light out of the OLED that would otherwise be internally reflected (until it is either absorbed or emitted from the side of the device). See, for example, T. Yamasaki et al, Appl. Phys. Lett. 76, 1243–1245 (2000); S. M. Garner et al., US 2004/0217702 A1; Y. S. Tyan et al., EP 1406474 A1; Y. Liu et al, US 2001/0026124 A1; and J. J. Shiang, US 2005/0018431 A1. Since the focus on scattering layers has been for increasing the device efficiency, it does not seem to have been generally recognized in the art that such scattering layers have another important advantage, when used in combination with a microcavity device (but outside of the microcavity itself), of improving the disadvantageous angular dependence that otherwise results from the microcavity effect. In fact, because the efficiency increases due to scattering and microcavity effects tend to at least partially counteract each other, US 2005/0018431 A1 teaches away from combining a scattering layer with a microcavity device. However, we have recognized that by combining a microcavity device with a scattering layer, one can obtain a device that is more efficient than a non-microcavity device but does not suffer (at least to as great a degree) the usual angular-dependence of a microcavity device. From a manufacturing point of view, however, it is particularly important to incorporate such scatterers in a way that adds little or no additional complexity to the device structure.

Figure 2:
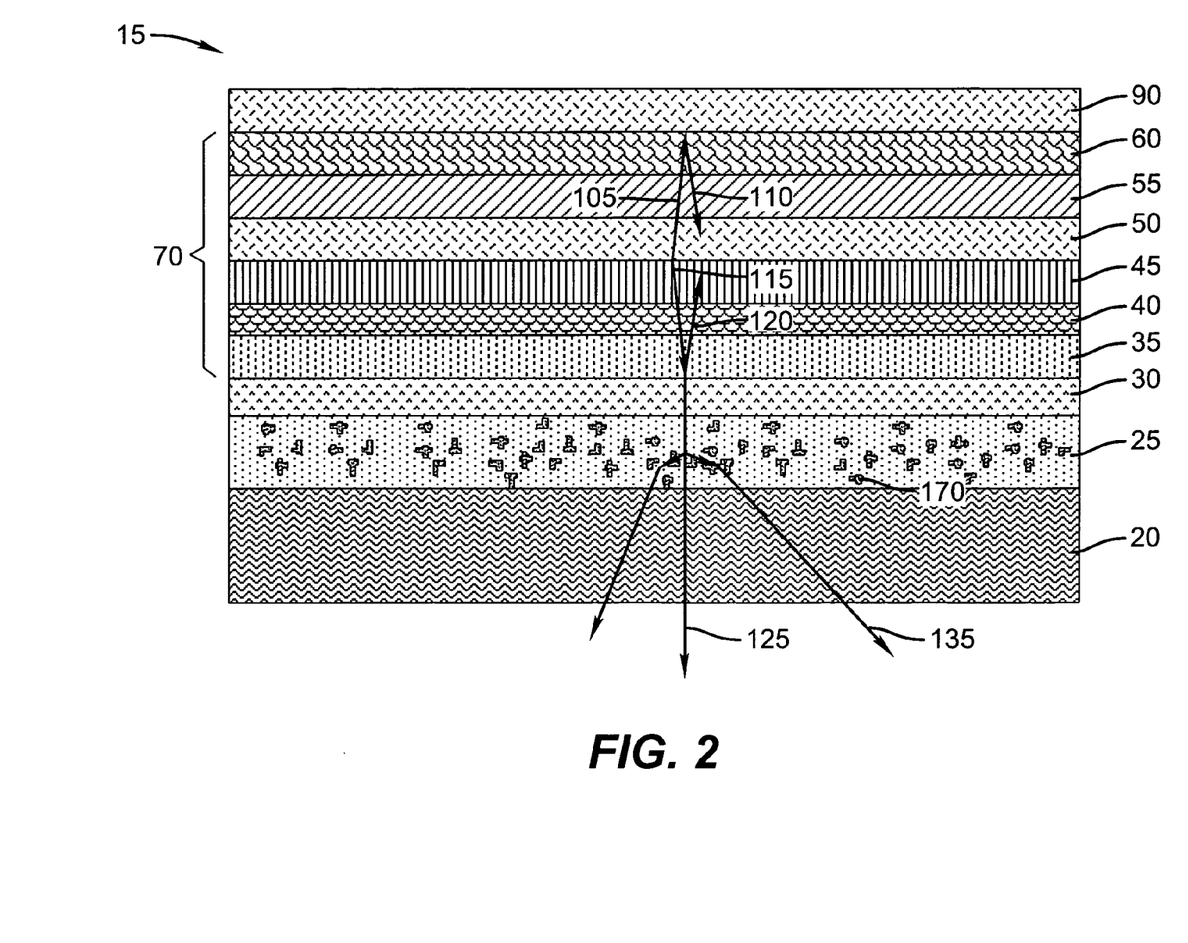
FIG. 2 shows a cross-sectional view of one embodiment of a microcavity color OLED device according to the present invention.

Turning now to FIG. 2, there is shown one embodiment of a microcavity color OLED device according to the present invention. Microcavity color OLED device 15 is constructed similar to microcavity color OLED device 10, except that color filter element 65 disposed over microcavity structure 70. Color filter element 65 includes a selective light-absorbing material designed to remove light of wavelengths other than the desired wavelength of on-axis light. Although the thickness of color filter element 65 can vary depending on the properties desired in a particular OLED device, a convenient thickness is 2 to 3 microns. Color filter element 65 includes light-scattering material 150, which is selected so as to reduce the angular dependence of the light that has passed through color filter element 65, that is, partially transmitted on-axis light 125, by partially scattering it as scattered light 135, thereby improving viewing of microcavity color OLED device 15 from an off-axis direction. This is achieved by selecting the properties of the particles of light-scattering material 150, e.g. their size, shape, and refractive index, which will be further described below. Light-scattering material 150 can be separate from the selective light-absorbing material, or can be part of the selective light-absorbing material, or a combination of both.

Light-scattering material 150 conveniently includes a particulate material wherein the particles are nanoparticles, that is comprising particles smaller than 1 micron in size. Desirably, the light-scattering material particles are in a range from 125 to 500 nm in size (measured as the mean diameter). For a blue color filter element, that is, a filter that passes primarily blue light, the desirable particle size range is from 125 to 350 nm. For a green color filter element, the desirable particle size range is from 150 to 400 nm. For a red color filter element, the desirable particle size range is from 175 to 500 nm. Light-scattering material 150 desirably has a refractive index of at least 1.25 times that of the color filter element medium in which the particles are embedded. Materials that are used as the medium in color filter elements typically have a refractive index of ~1.55–1.6, which implies that the refractive index of the particles of light-scattering material 150 should be greater than 2.0. Non-limiting examples of materials with the desired refractive index include magnesium oxide, titanium dioxide, zirconium oxide, beryllium oxide, tin sulfide, or zinc selenide, or combinations thereof. Some polymeric materials, such as OptiNDEX A14 available from Brewer Science, can also be used as light-scattering material 150.

When light-scattering material 150 is an added material to an existing color filter formulation, that is, when light-scattering material 150 is separate from the selective light-absorbing material, light-scattering material 150 is present in the range of 1% to 15% by weight. In another embodiment, light-scattering material 150 can be part of the selective light-absorbing material. In other words, light-scattering material 150 is a material that absorbs some wavelengths of light, thus acting as a color filter material. Light-scattering material 150 does not absorb some other wavelengths, but acts as a light-scattering material for light not absorbed. For example, light-scattering material 150 can be a green filter material. As such, it will absorb blue and red light, and it will scatter—but not absorb—green light. When light-scattering material 150 is part of the selective light-absorbing material, it is present in the range of 15–25% by weight.

The desirable characteristics of the light-scattering particles are determined by considering the degree of scattering and the angular distribution of the scattering produced by the particles. The degree of light scattering expected can be represented by the following formula:

$$\text{degree of scattering} = \sigma \rho t$$

where $\sigma$ is the average scattering cross-section of a particle, $\rho$ is the number of particles per volume, and t is the thickness of the scattering layer.

When the degree of scattering is much less than 1, a light ray is unlikely to be scattered. When the degree of scattering is much greater than 1, a light ray is likely to be scattered multiple times in many directions, including back in the direction of origination. When the degree of scattering is approximately 1, light rays on average will be scattered once and (with the particle size range suitably chosen) will be scattered more in the forward direction than in the backward direction, which is the most desirable outcome. For the practice of this invention, it is desirable that the degree of scattering be between 0.1 and 10. More desirably, the degree of scattering should be between 0.5 and 3.

The microcavity color OLED device 15 of this invention and any pixels therein are typically disposed as shown over a supporting substrate 20. Substrate 20 can either be light transmissive or opaque, depending on the intended direction of light emission. The light transmissive property is desirable for viewing the EL emission through substrate 20, that is, a bottom-emitting device as shown. Transparent glass or plastic is commonly employed in such cases. For applications where the device is top-emitting, the transmissive characteristic of substrate 20 is immaterial, and therefore can be light transmissive, light absorbing or light reflective. Substrates for use in this case include, but are not limited to, glass, plastic, semiconductor materials, silicon, ceramics, and circuit board materials.

One undesirable characteristic of scatterers in OLED devices is light that is totally internally reflected on one pass can then scattered out of the device on a subsequent pass. If the light has traveled through a substrate or other layer of significant thickness (relative to the distance between pixels on the device), it can emerge from a pixel location far removed from its original emission location, resulting in a loss of image sharpness or contrast. If it is necessary to minimize this effect, a spacer layer of air or other low refractive index material can be used between color filter element 25 and substrate 20 to increase total internal reflectance.

Microcavity structure 70 can include transparent cavity-spacer layer 35, which can be disposed between one of the reflectors and light-emitting layer 50. It must be transparent to the emitted light and as shown it must to be conductive to carry the charge between the electrode (which is the reflector) and the light-emitting layer 50. Since only through-film conductance is important, a bulk resistivity of less than about $10^8$ ohm-cm is adequate. Many metal oxides such as, but not limited to, indium-tin oxide (ITO), zinc-tin oxide (ZTO), tin-oxide (SnOx), indium oxide (InOx), molybdenum oxide (MoOx), tellurium oxide (TeOx), antimony oxide (SbOx), indium-zinc oxide (IZO), and zinc oxide (ZnOx), can be used. If transparent cavity-spacer layer 35 is not conductive, a transparent electrode can be formed above transparent cavity-spacer layer 35 in a way in which the transparent electrode would be in electrical contact with the circuitry. The transparent electrode can be constructed of a metal oxide as described above. The thickness of transparent cavity-spacer layer 35, refractive index of transparent cavity-spacer layer 35, or both are adjusted in conjunction with the thickness and refractive index of the layers of microcavity color OLED device 15 to tune microcavity structure 70 to the desired color.

Microcavity color OLED device 15 further includes organic layers. There are numerous configurations of the organic layers known in the art wherein the present invention can be successfully practiced, including hole-injecting layer 40, hole-transporting layer 45, light-emitting layer 50, electron-transporting layer 55, and electron-injecting layer 60.

While not always necessary, it is often useful to provide a hole-injecting layer 40. Hole-injecting layer 40 can serve to improve the film formation property of subsequent organic layers and to facilitate hole injection into hole-transporting layer 45. Suitable materials for use in hole-injecting layer 40 include, but are not limited to, porphyrinic compounds as described in U.S. Pat. No. 4,720,432, plasma-deposited fluorocarbon polymers as described in U.S. Pat. Nos. 6,127,004; 6,208,075 and 6,208,077, and some aromatic amines, for example, m-MTDATA (4,4',4"-tris[(3-methylphenyl)phenylamino]triphenylamine). Alternative hole-injecting materials for organic EL devices are described in EP 0 891 121 A1 and EP 1 029 909 A1.

Hole-transporting layer 45 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active-hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Hole-transporting layer 45 can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',"-tris[(3-methylphenyl)phenylamino]triphenylamine Another class of useful hole-transporting materials includes polycyclic aromatic compounds as described in EP 1 009 041. Tertiary aromatic amines with more than two amine groups can be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

As more fully described in U.S. Pat. Nos. 4,769,292 and 5,935,721, light-emitting layer 50 includes a luminescent or fluorescent material where electroluminescence is produced as a result of electron-hole pair recombination in this region, producing light. Light-emitting layer 50 can include a single material, but more commonly consists of a host material doped with a guest compound or compounds where light emission comes primarily from the dopant and can be of any color. The host materials in light-emitting layer 50 can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant can be added by copolymerizing a minor constituent into the host polymer.

An important relationship for choosing a dye as a dopant is a comparison of the bandgap potential, which is defined as the energy difference between the highest occupied molecular orbital and the lowest unoccupied molecular orbital of the molecule. For efficient energy transfer from the host to the dopant molecule, a necessary condition is that the bandgap of the dopant is smaller than that of the host material. For phosphorescent emitters it is also important that the host triplet energy level be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)]

CO-2: Magnesium bisoxine [alias, bis(8-quinolinolato)magnesium(II)]

CO-3: Bis[benzo{f}-8-quinolinolato]zinc (II)

CO-4: Bis(2-methyl-8-quinolinolato)aluminum(III)-μ-oxo-bis(2-methyl-8-quinolinolato) aluminum(III)

CO-5: Indium trisoxine [alias, tris(8-quinolinolato)indium]

CO-6: Aluminum tris(5-methyloxine) [alias, tris(5-methyl-8-quinolinolato)aluminum(III)]

CO-7: Lithium oxine [alias, (8-quinolinolato)lithium(I)]

CO-8: Gallium oxine [alias, tris(8-quinolinolato)gallium(III)]

CO-9: Zirconium oxine [alias, tetra(8-quinolinolato)zirconium(IV)]

Other classes of useful host materials include, but are not limited to: derivatives of anthracene, such as 9,10-di-(2-naphthyl)anthracene and derivatives thereof as described in U.S. Pat. No. 5,935,721, distyrylarylene derivatives as described in U.S. Pat. No. 5,121,029, and benzazole derivatives, for example, 2,2',2"-(1,3,5-phenylene)tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds.

Preferred thin film-forming materials for use in forming electron-transporting layer 55 of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

An electron-injecting layer 60 can also be present between the cathode and the electron-transporting layer. Examples of electron-injecting materials include alkaline or alkaline earth metals, alkali halide salts, such as LiF mentioned above, or alkaline or alkaline earth metal doped organic layers.

In some instances, light-emitting layer 50 and electron-transporting layer 55 can optionally be replaced by a single layer that serves the function of supporting both light emission and electron transportation. It is also known in the art that emitting dopants can be added to the hole-transporting layer 45, which can serve as a host. Multiple dopants can be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235; EP 1 182 244; U.S. Patent Application Publication 2002/0025419; U.S. Pat. Nos. 5,683,823; 5,503,910; 5,405,709; and 5,283,182. As shown in commonly-assigned EP 1 187 235 A2, a white emitting organic EL media can be achieved by the inclusion of the following layers; a hole-injecting layer 40, a hole-transporting layer 45 that is disposed over hole-injecting layer 40 and is doped with a rubrene compound for emitting light in the yellow region of the spectrum, a light-emitting layer 50 doped with a blue-light-emitting compound disposed over hole-transporting layer 45, and an electron-transporting layer 55 disposed over light-emitting layer 50. Alternate embodiments where one or more different materials are used in the organic layers for different pixels can also be applied to the present invention. These techniques can be applied to tuned OLED device 15 so that light-emitting layer 50 produces white light, also called broadband wavelength light.

Additional layers such as electron- or hole-blocking layers as taught in the art can be employed in devices of this invention. Hole-blocking layers are commonly used to improve efficiency of phosphorescent emitter devices, for example, as in U.S. Patent Application Publication 2002/0015859.

The organic materials above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551; 5,851,709; and 6,066,357) and inkjet method (U.S. Pat. No. 6,066,357).

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of this invention can employ various well-known optical effects in order to enhance their properties if desired. This includes but is not limited to optimizing layer thicknesses to yield maximum light transmission, providing dielectric mirror structures, providing anti-glare or anti-reflection coatings over the display, providing a polarizing medium over the display, or providing colored, neutral density, or color conversion filters over the display.

Figure 3:
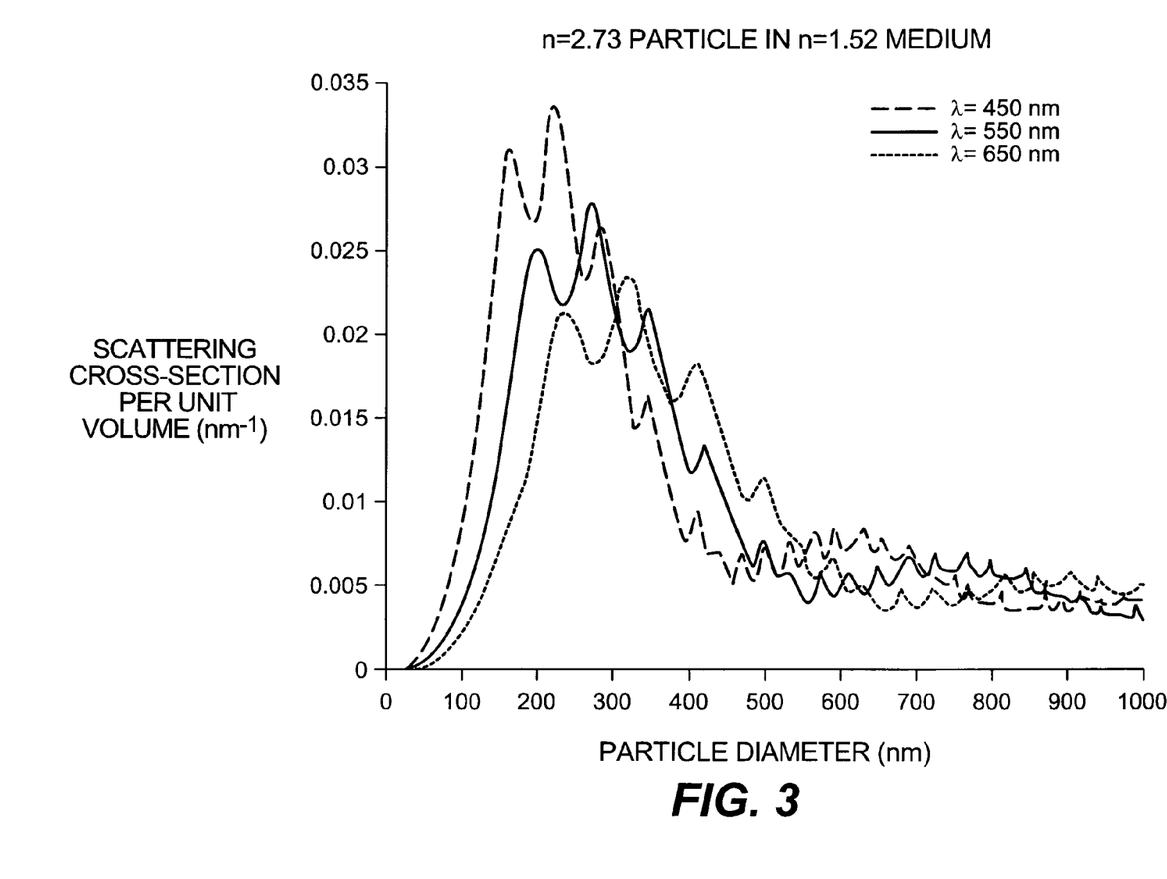
FIG. 3 shows the scattering cross-section per unit volume of a single particle as computed by Mie theory for light in the red, green, and blue parts of the spectrum.

FIG. 3 shows the scattering cross-section per unit volume of a single particle having a refractive index of $n=2.73$ immersed in a medium with refractive index $n=1.52$, as computed by Mie theory for three different wavelengths of light in the red, green, and blue parts of the spectrum. The most efficient use of the scattering material occurs when the scattering cross-section per unit volume is maximized. From this graph, one can determine the optimal particle sizes for a given wavelength of light.

Another concern in the determination of the optimal size of the scattering particles is the scattering direction. In general, when the scatterers are very small, the scattering is fairly isotropic in direction with a nearly equal amount of scattering in the forward and backward half-spaces. As the scatterers become larger, more of the light is scattered into a narrower cone in the forward direction. FIGS. 4 through 8 illustrate the angular distribution of the scattered light for particles of various sizes. More specifically, they show a polar plot giving the angular distribution of the scattered light of wavelength $\lambda=550$ nm from a single particle having refractive index of $n=2.73$ immersed in a medium with refractive index $n=1.52$ as computed by Mie theory. The particle diameter of scattering material 150 is 60 nm in FIG. 4, 100 nm in FIG. 5, 200 nm in FIG. 6, 300 nm in FIG. 7, and 800 nm in FIG. 8. Also shown in the figures by the dashed lines is the critical angle of ~41° for light emerging into air from a medium of $n=1.52$. In drawing conclusions, it is important to remember that this critical angle is measured relative to the normal of the layer whereas the scattering angle is measured relative to the direction of the light ray.

Figure 4:
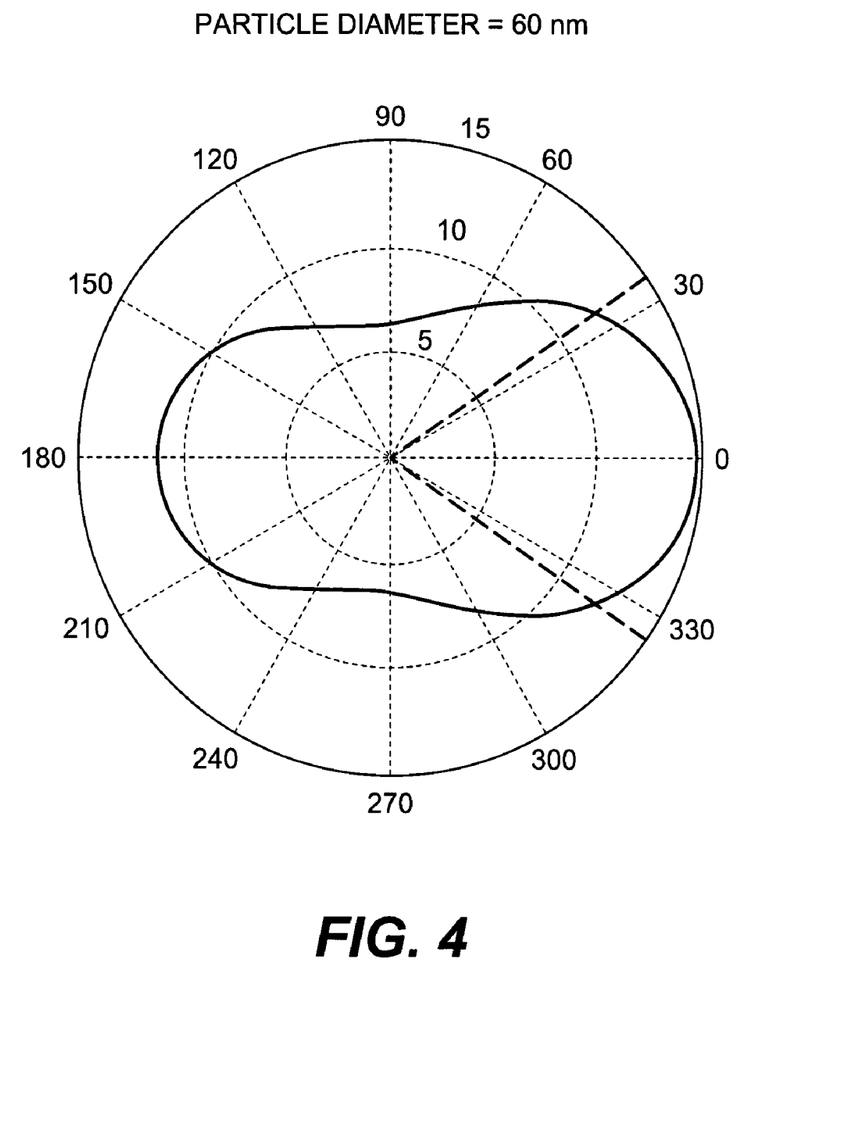
FIG. 4 shows a polar plot giving the angular distribution of the scattered light from a single 60 nm particle as computed by Mie theory for light of wavelength $\lambda=550$ nm.
Figure 5:
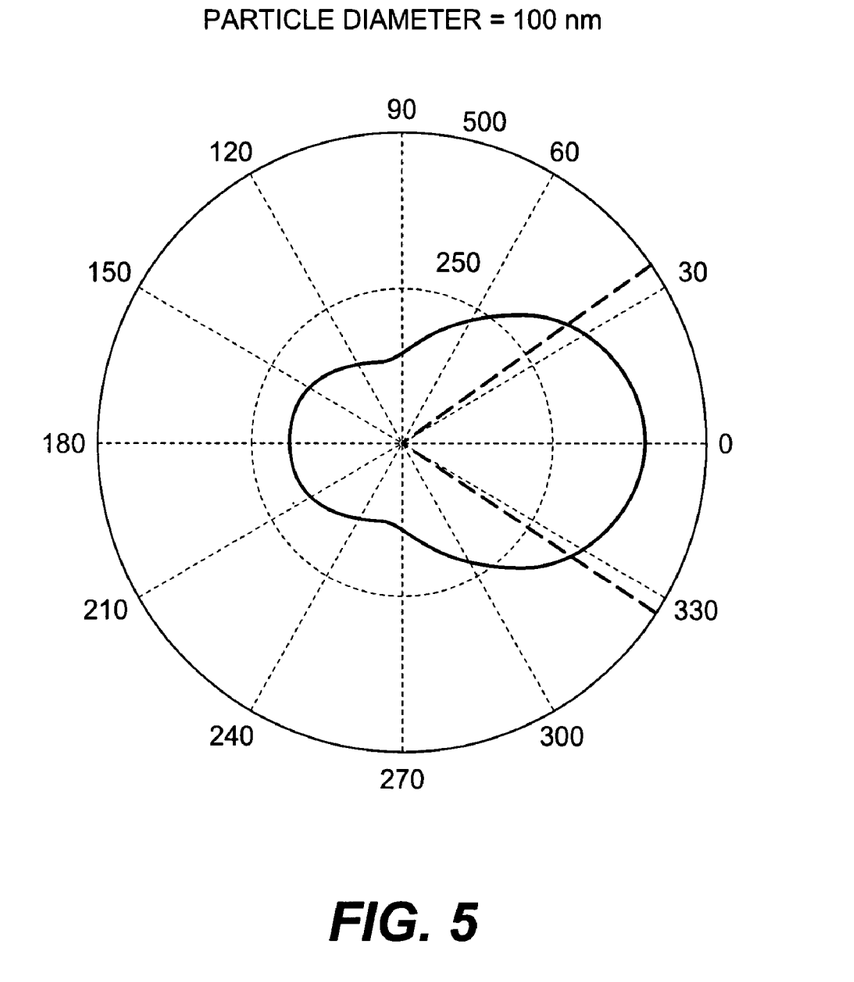
FIG. 5 shows a polar plot giving the angular distribution of the scattered light from a single 100 nm particle as computed by Mie theory for light of wavelength $\lambda=550$ nm.
Figure 6:
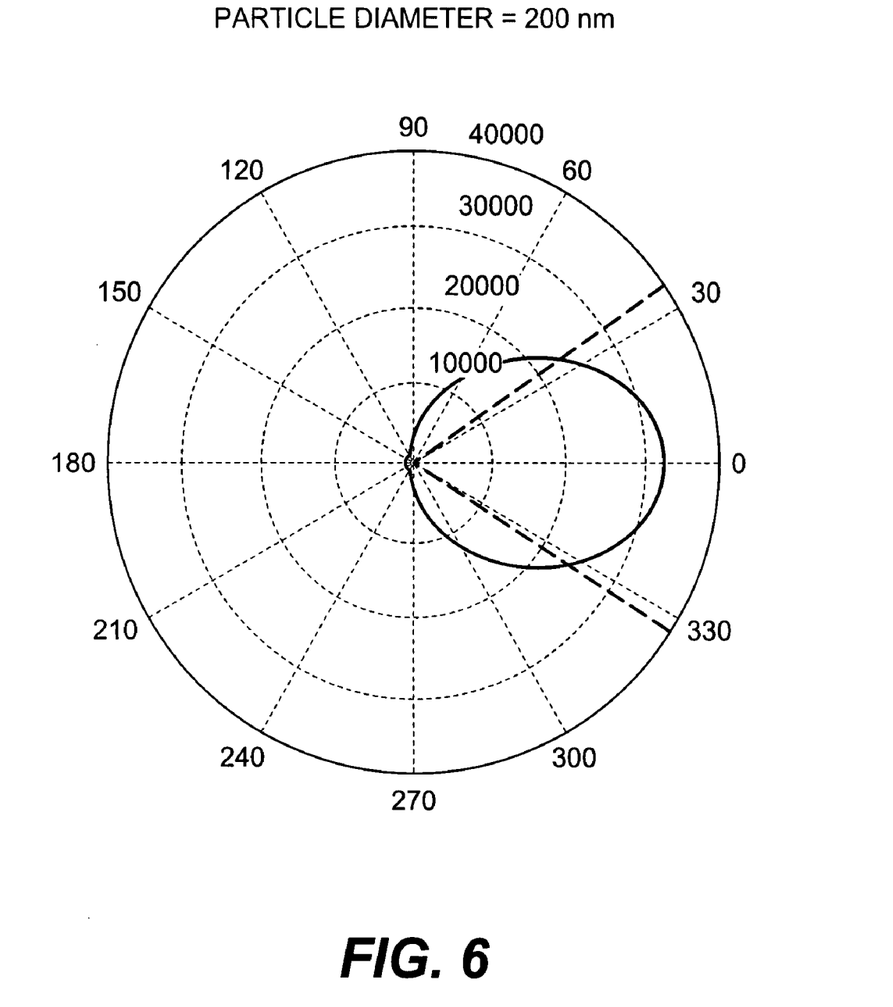
FIG. 6 shows a polar plot giving the angular distribution of the scattered light from a single 200 nm particle as computed by Mie theory for light of wavelength $\lambda=550$ nm.
Figure 7:
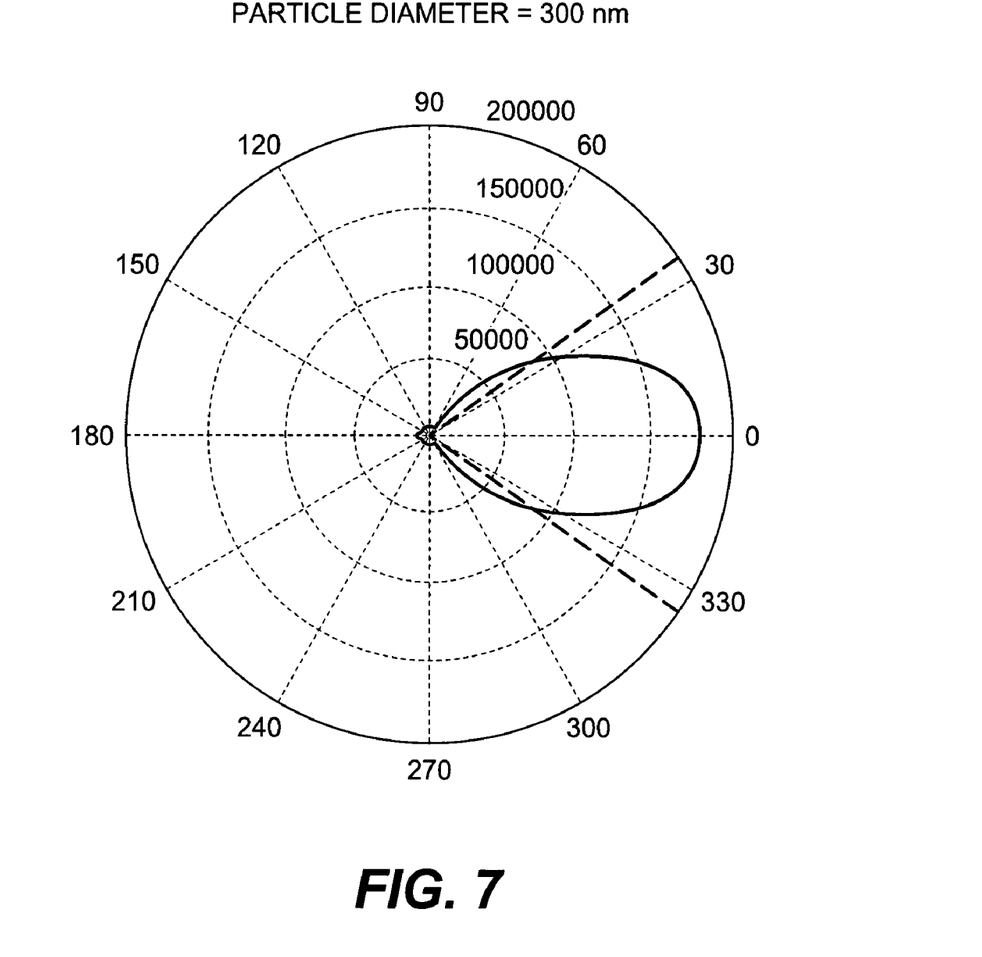
FIG. 7 shows a polar plot giving the angular distribution of the scattered light from a single 300 nm particle as computed by Mie theory for light of wavelength $\lambda=550$ nm.
Figure 8:
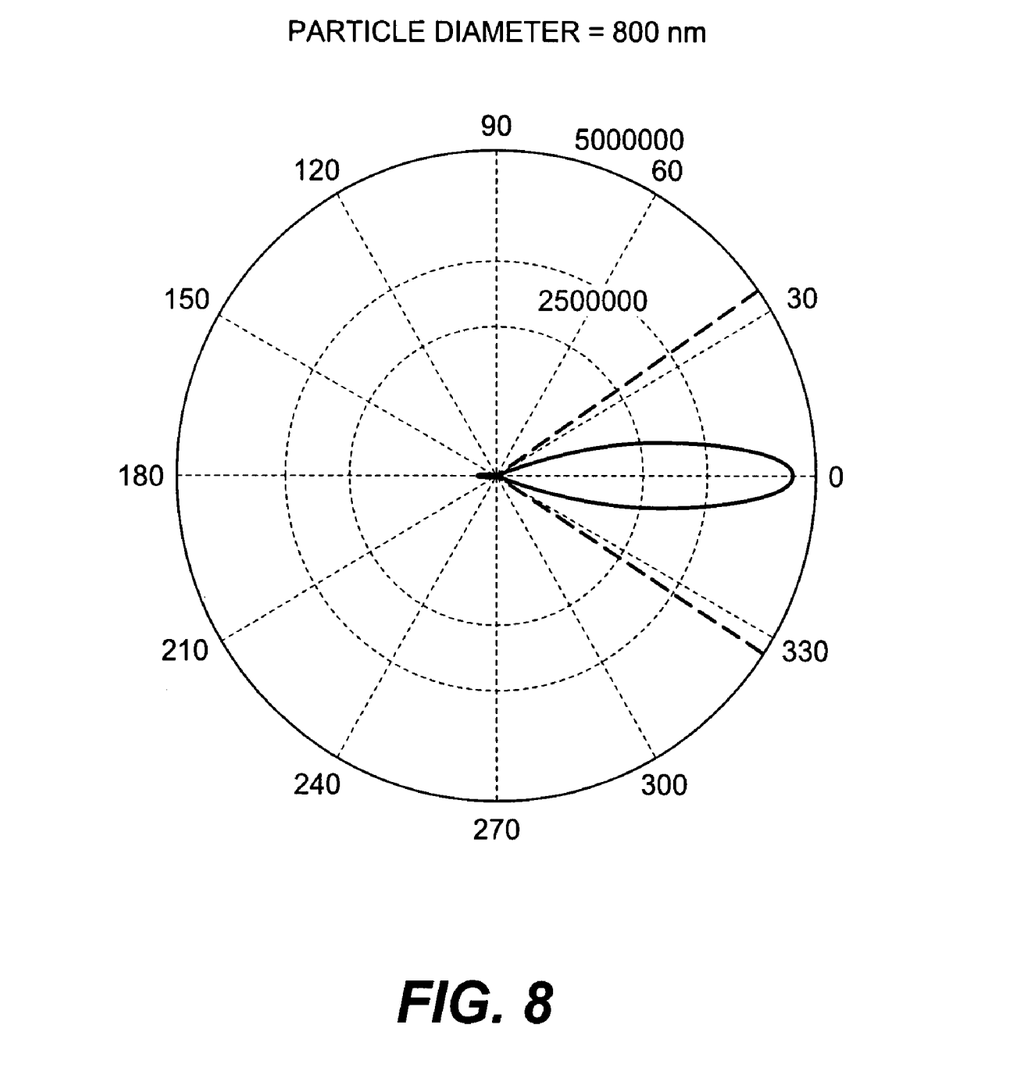
FIG. 8 shows a polar plot giving the angular distribution of the scattered light from a single 800 nm particle as computed by Mie theory for light of wavelength $\lambda=550$ nm.

Determining exactly what is the most desirable angular distribution of scattered light will depend on a number of factors, including the perceived usage of the device in question. However, it can be said that the large amount of light that is scattered back in the case of very small particles (e.g. as shown in FIG. 4) is undesirable because some of this light will be absorbed in the subsequent pass through the microcavity and will thus not be emitted from the device. On the other hand, in the case of very large particles where the light is scattered into a narrow forward cone relative to the original light direction (e.g. as shown in FIG. 8), much of the light will be scattered so little that the angular dependence on color will not be significantly reduced. Thus, the desirable particle diameters are between these two extremes.

The invention has been described in detail with particular reference to certain preferred embodiments thereof, but it will be understood that variations and modifications can be effected within the spirit and scope of the invention.

PARTS LIST 10 microcavity color OLED device
15 microcavity color OLED device
20 substrate
25 color filter element
30 semi-transparent reflector/electrode
35 transparent cavity-spacer layer
40 hole-injecting layer
45 hole-transporting layer
50 light-emitting layer
55 electron-transporting layer
60 electron-injecting layer
65 color filter element
70 microcavity structure
90 reflector/electrode
105 light
110 reflected light
115 light 120 partially reflected light
125 partially transmitted on-axis light
135 scattered light
140 partially transmitted off-axis light
150 light-scattering material

The invention claimed is:

1. A microcavity color OLED device, comprising:
 a) at least one light-emitting layer arranged so as to produce light;
 b) a reflector and a semi-transparent reflector forming a microcavity structure for resonating the light produced in the at least one light emitting layer; and
 c) a color filter element disposed over the microcavity structure including a light-scattering material selected so as to reduce the angular dependence of the light that has passed through the color filter element.

2. The microcavity color OLED device of claim 1 where the reflector, the semi-transparent reflector, or both, also serve as electrodes for the light emitting layer.

3. The microcavity color OLED device of claim 1 where the semi-transparent reflector is Ag or an alloy containing Ag.

4. The microcavity color OLED device of claim 1 where the device is top-emitting.

5. The microcavity color OLED device of claim 1 where the device is bottom-emitting.

6. The microcavity color OLED device of claim 1 wherein the light-scattering material is particulate and the particles are nanoparticles.

7. The microcavity color OLED device of claim 6 wherein the light-scattering material particles are in a range of from 125 to 500 nm.

8. The microcavity color OLED device of claim 7 wherein the color filter element is a blue color filter element and the light-scattering material particles are in a range of from 125 to 350 nm.

9. The microcavity color OLED device of claim 7 wherein the color filter element is a green color filter element and the light-scattering material particles are in a range of from 150 to 400 nm.

10. The microcavity color OLED device of claim 7 wherein the color filter element is a blue color filter element and the light-scattering material particles are in a range of from 175 to 500 nm.

11. The microcavity color OLED device of claim 1 wherein the light-scattering material has a refractive index greater than 1.25 times the refractive index of the color filter element medium.

12. The microcavity color OLED device of claim 11 wherein the light-scattering material includes magnesium oxide, titanium dioxide, zirconium oxide, beryllium oxide, tin sulfide, or zinc selenide, or combinations thereof.

13. A microcavity color OLED device, comprising:
 a) at least one light-emitting layer arranged so as to produce light;
 b) a reflector and a semi-transparent reflector forming a microcavity structure for resonating the light produced in the at least one light emitting layer; and
 c) a color filter element disposed over the microcavity structure including a selective light-absorbing material, a light scattering material separate from the selective light-absorbing material or part of the selective light-absorbing material or both and selected so as to reduce the angular dependence of the light that has passed through the color filter element.

14. The microcavity color OLED device of claim 13 wherein the light-scattering material is particulate and the particles are nanoparticles.

15. The microcavity color OLED device of claim 14 wherein the light-scattering material particles are in a range of from 125 to 500 nm.

16. The microcavity color OLED device of claim 15 wherein the color filter element is a blue color filter element and the light-scattering material particles are in a range of from 125 to 350 nm.

17. The microcavity color OLED device of claim 15 wherein the color filter element is a green color filter element and the light-scattering material particles are in a range of from 150 to 400 nm.

18. The microcavity color OLED device of claim 15 wherein the color filter element is a blue color filter element and the light-scattering material particles are in a range of from 175 to 500 nm.

19. The microcavity color OLED device of claim 13 wherein the light-scattering material has a refractive index greater than 1.25 times the refractive index of the color filter element medium.

20. The microcavity color OLED device of claim 19 wherein the light-scattering material includes magnesium oxide, titanium dioxide, zirconium oxide, beryllium oxide, tin sulfide, or zinc selenide, or combinations thereof.

21. The microcavity color OLED device of claim 13 where the reflector, the semi-transparent reflector, or both, also serve as electrodes for the light emitting layer.

22. The microcavity color OLED device of claim 13 where the semi-transparent reflector is Ag or an alloy containing Ag.

23. The microcavity color OLED device of claim 13 where the device is top-emitting.

24. The microcavity color OLED device of claim 13 where the device is bottom-emitting.

25. A full color OLED device having an array of pixels which include different subpixels that emit different color light and wherein each subpixel comprises:
 a) at least one light emitting layer arranged to produce light, wherein the light produced by each subpixel is a different color;
 b) a reflector and a semi-transparent reflector forming a microcavity structure for resonating the light produced in the at least one light emitting layer; and
 c) a color filter element disposed over the microcavity structure including a selective light-absorbing material, a light scattering material separate from the selective light-absorbing material or part of the selective light-absorbing material or both and selected so as to reduce the angular dependence of the light that has passed through the color filter element.

26. The full color OLED device of claim 25 wherein the light-scattering material is particulate and the particles are nanoparticles.

27. The full color OLED device of claim 26 wherein the light scattering material particles are in a range of from 125 to 500 nm.

28. The full color OLED device of claim 27 wherein the color filter element is a blue color filter element and the light-scattering material particles are in a range of from 125 to 350 nm.

29. The full color OLED device of claim 27 wherein the color filter element is a green color filter element and the light-scattering material particles are in a range of from 150 to 400 nm.

30. The full color OLED device of claim 27 wherein the color filter element is a blue color filter element and the light-scattering material particles are in a range of from 175 to 500 nm.

31. The full color OLED device of claim 25 wherein the light-scattering material has a refractive index greater than 1.25 times the refractive index of the color filter element medium.

32. The full color OLED device of claim 31 wherein the light-scattering material includes magnesium oxide, titanium dioxide, zirconium oxide, beryllium oxide, tin sulfide, or zinc selenide, or combinations thereof.

33. The full color OLED device of claim 25 where the reflector, the semi-transparent reflector, or both, also serve as electrodes for the light emitting layer.

34. The full color OLED device of claim 25 where the semi-transparent reflector is Ag or an alloy containing Ag.

35. The full color OLED device of claim 25 where the device is top-emitting.

36. The full color OLED device of claim 25 where the device is bottom-emitting.

* * * * *